United States Patent [19]
Mita et al.

[11] Patent Number: 4,697,204
[45] Date of Patent: Sep. 29, 1987

[54] LEADLESS CHIP CARRIER AND PROCESS FOR FABRICATION OF SAME

[75] Inventors: Tsunemasa Mita; Ryoki Katoh; Soichi Sekimoto; Yoshiyuki Shiratsuki; Hiroshi Arisawa, all of Ebina, Japan

[73] Assignee: Fuji Xerox Co., Ltd., Toyko, Japan

[21] Appl. No.: 516,451

[22] Filed: Jul. 22, 1983

[30] Foreign Application Priority Data

Jul. 27, 1982 [JP] Japan .................. 57-131013

[51] Int. Cl.$^4$ ........................... H01L 23/02
[52] U.S. Cl. ........................... 357/74; 357/80
[58] Field of Search ............. 357/74, 80, 79, 81; 174/52 FP

[56] References Cited

U.S. PATENT DOCUMENTS

| | | | |
|---|---|---|---|
| 4,288,841 | 9/1981 | Gogal | 357/74 |
| 4,463,217 | 7/1984 | Orcutt | 357/74 |
| 4,554,575 | 11/1985 | Lucas | 357/80 |

FOREIGN PATENT DOCUMENTS

| | | | |
|---|---|---|---|
| 107249 | 8/1980 | Japan | 357/74 |
| 27549 | 2/1984 | Japan | 357/74 |

*Primary Examiner*—William L. Sikes
*Assistant Examiner*—Frank González
*Attorney, Agent, or Firm*—Spensley Horn Jubas & Lubitz

[57] ABSTRACT

A leadless chip carrier is constructed in such a manner that each of the electrode terminals is made to be recessed from the insulation layer of the bottom surface of the carrier so as to have a difference in level between the bottom surface and at least a part of the electrode terminal. Because of such construction, when the electrode terminals are bonded to the conductors of the printed circuit board in the reflowing method, molten solder is collected in the recessed portions of the electrode terminals besides each portion of the insulation layer positioned between the electrode terminals prevents flowing of the molten solder in the recessed portion, so that strength and reliability in the bonding are remarkably improved.

3 Claims, 4 Drawing Figures

FIG.1 (a)
PRIOR ART
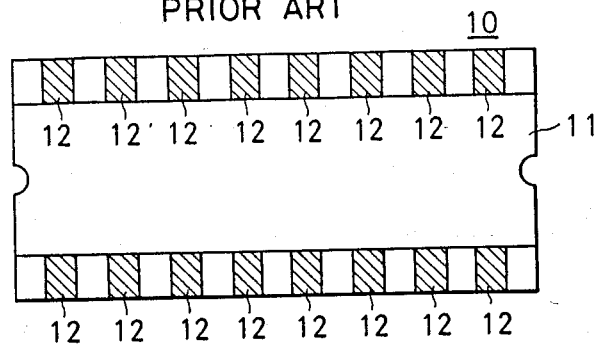
FIG.1 (b)
PRIOR ART
FIG. 2 (a)
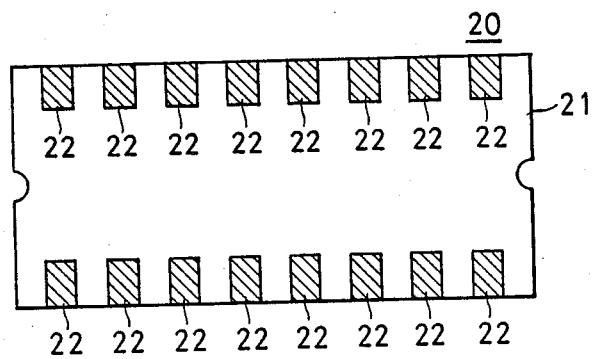
FIG. 2 (b)

LEADLESS CHIP CARRIER AND PROCESS FOR FABRICATION OF SAME

BACKGROUND OF THE INVENTION

1. Field of the Invention

The present invention relates to a leadless chip carrier having terminals to be connected to external circuits (hereinafter referred to as "electrode terminals") on the bottom thereof in place of lead wires and a process for the fabrication of the same. More particularly, the present invention relates to an improvement on the construction of such electrode terminals.

2. Description of the Prior Art

Recently, with increase of demand for reducing size and weight and further for enhancing performance of electronic equipments, leadless chip carriers having electrode terminals become utilized in IC (integrated circuits) or elements such as diode which compose circuits in place of discrete type connecting means having lead wires.

FIGS. 1(a) and 1(b) show an example of conventional leadless chip carriers which are now widely used wherein FIG. 1(a) is a bottom plan view showing a leadless chip carrier 10, and FIG. 1(b) is a side view of the leadless chip carrier 10 in FIG. 1(a).

The leadless chip carrier 10 comprises an insulation layer 11, electrode terminals 12, and a cap 13 for protecting internal circuit.

In mounting such leadless chip carrier 10 on a printed circuit board (not shown), there have been typically two conventional methods which will be described hereinbelow.

One is a so-called reflowing method wherein cream-like soldering paste has previously been applied on the surface of the electric circuit pattern on a printed circuit board to which the leadless chip carrier 10 is to connect, the bottom of the leadless chip carrier 10 is temporarily fixed by utilizing adhesiveness of the soldering paste, and then the soldering paste is heated at an elevated temperature to remelt the same for bonding.

According to the reflowing method, there is such an advantage that a favourable soldering can be effected irrespective of a construction of the electrode terminals 12, besides an area of the soldered joint is very small so that high density assembly of a device becomes possible. On the other hand, there is such a disadvantage that a position of the leadless chip carrier 10 is easily deviated because of flowability of solder when the soldering paste is remelted at the elevated temperature. Particularly, when a chip carrier having a narrow lead spacing are attached to a printed-circuit board, adjacent leads are likely to be short-circuited, even if the aforesaid deviation is very slight, and as a result, it is difficult to attain high density assembly. In addition, since a surface of metallized layer of the electrode terminal 12 is flat as shown in FIG. 1(b), a sufficient amount of solder cannot be applied to a portion where the metallized layer contacts with a conductor of the printed circuit board, and hence, sufficient bonding strength could not be attained.

Another method has been proposed to solve the above-mentioned problems wherein first, the bottom of the leadless chip carrier 10 is bonded to a desired position of the printed circuit board by the use of a bonding material, and then the leadless chip carrier 10 is immersed in a bath of molten solder together with the printed circuit board. In accordance with this method, bonding strength is undoubtedly elevated as compared with that of the former method. However, this method is likely to cause soldering failure or imperfect soldering due to solder bridge or collected flux produced in its soldering process in the case where a plurality of the leadless chip carriers 10 are mounted closely to each other. Thus, considerable time and man-power are often required for correcting the troubled portions after completing the soldering.

Accordingly, it is an object of the present invention to provide a leadless chip carrier by which strength and reliability bonding of the leadless chip carrier to conductors on a printed circuit board can be elevated, so that high-density assembly becomes possible.

SUMMARY OF THE INVENTION

According to the present invention, a leadless chip carrier is constructed in such a manner that each of the electrode terminals is made to be recessed from the insulation layer of the bottom surface of the carrier so as to have a difference in level between the bottom surface and at least a part of the electrode terminal. Because of such construction, when the electrode terminals are bonded to the conductors of the printed circuit board in the reflowing method, molten solder is collected in the recessed portions of the electrode terminals, besides each portion of the insulation layer positioned between the electrode terminals prevents flowing of the molten solder in the recessed portion, so that strength and reliability in the bonding are remarkably improved.

BRIEF DESCRIPTION OF THE DRAWING

In the accompanying drawings:

FIGS. 1(a) and 1(b) are a bottom plan view and side view showing a construction of a conventional leadless chip carrier; and FIGS. 2(a) and 2(b) are a bottom plan view and a side view showing a construction of an embodiment of the leadless chip carrier according to the present invention.

DESCRIPTION OF THE PREFERRED EMBODIMENT

The leadless chip carrier according to the present invention will be described in detail hereinbelow in conjunction with an embodiment illustrated in the accompanying drawing.

Referring to FIGS. 2(a) and 2(b), the leadless chip carrier 20 comprises an insulation layer 21, electrode terminals 22, and a cap 23 for protecting its internal circuit in the same manner as that of FIG. 1 as previously described. As is apparent from FIG. 2(b), the chip carrier 20 according to the present invention has electrode terminals each of which is recessed from the bottom surface of the insulation layer 21 to define a recessed portion 22'.

With such construction, when the leadless chip carrier 20 is bonded to a printed circuit board (not shown) in the reflowing method, bonding strength can be enhanced since the electrode terminals 22 and the conductor of the printed circuit board do not directly contact with each other, whilst a molten solder is collected in recessed portions of the electrode terminals 22, and as a result, the amount of the solder as well as a surface area relating to the bonding increase.

In addition, each portion of the insulation layer 21 positioned between the electrode terminals 22 functions to prevent flowing of the molten solder so that deviation in position does not likely to occur unlike the case of conventional leadless chip carriers as described before.

In this embodiment, a silk screen printing process may be adopted for forming the leadless chip carrier 20 into a construction as shown in FIG. 2. This process is such that an insulating material such as glass or the like having a thickness of several 10 $\mu$m is printed on not only the central portion of the bottom surface of the leadless chip carrier but also portions positioned between the respective electrode terminals 22 to form the insulation layer 21, whereby the portions of the electrode terminal 22 can be recessed.

Although the embodiment illustrated in FIG. 2 has been described a case where each electrode terminal 22 is disposed only on the bottom portion of the recessed portion, the electrode terminal 22 may be disposed on the whole surface of each recessed part (i.e. bottom portion and side wall portion) by means of plating or the like. As a result of such construction, reliability is further elevated in bonding of the leadless chip carrier to the conductors on printed circuit board.

Furthermore, another method may also be adopted for forming the leadless chip carrier 20 into the construction as shown in FIG. 2 in which electrode terminals are disposed on the bottom surface in the screen printing process, thereafter a ceramic sheet with the terminal parts being blanked is laminated on the bottom surface, and then the ceramic laminated surface is sintered thereby integrally forming the insulation layer 21 with the electrode terminals 22 with a recess for each of the electrode terminals.

What is claimed is:

1. In a leadless chip carrier for carrying a chip comprising:
    an insulation layer having a top surface on which said chip is mounted, and a bottom surface opposing said top surface, and
    a plurality of terminals spaced next to each other, said terminals being disposed on said bottom surface of said insulation layer;
    the improvement wherein said insulation layer has a plurality of recesses on said bottom surface, each of said terminals being disposed in each of said recesses.

2. A leadless chip carrier as claimed in claim 1 wherein an insulating paste is applied to said bottom surface of said insulation layer, except where said terminals are disposed, said insulating paste then to be sintered.

3. A leadless chip carrier as claimed in claim 1 wherein laminated ceramic sheets are provided on said bottom surface of said insulation layer, except where said terminals are disposed, said laminated ceramic sheets to be sintered so as to integrate said laminated ceramic sheets.

* * * * *